United States Patent [19]

Matsuki, Koji

[11] Patent Number: 5,220,281
[45] Date of Patent: Jun. 15, 1993

[54] BOUNDARY SCAN CELL FOR BI-DIRECTIONAL INPUT/OUTPUT TERMINALS

[75] Inventor: Matsuki, Koji, Kamakura, Japan

[73] Assignee: Kabushiki Kaisha Toshiba, Kawasaki, Japan

[21] Appl. No.: 827,225

[22] Filed: Jan. 28, 1992

[30] Foreign Application Priority Data

Jan. 28, 1991 [JP] Japan .................. 3-008652

[51] Int. Cl.⁵ .............................. G06F 11/00
[52] U.S. Cl. .................. 324/158 R; 324/73.1; 371/22.3
[58] Field of Search ............ 324/158 R, 73.1; 371/22.1, 22.6, 15.1, 22.3, 22.4, 25, 27; 307/445, 446

[56] References Cited

U.S. PATENT DOCUMENTS

| | | | |
|---|---|---|---|
| 4,554,664 | 11/1985 | Schultz | 371/22.3 |
| 4,833,676 | 5/1989 | Koo | 371/22.3 |
| 4,870,345 | 9/1989 | Tomioka et al. | 371/22.3 |
| 4,912,709 | 3/1990 | Teske et al. | 371/22.3 |
| 5,042,034 | 8/1991 | Correale, Jr. et al. | 371/22.4 |

FOREIGN PATENT DOCUMENTS

2-234087 9/1990 Japan .

*Primary Examiner*—Vinh Nguyen
*Attorney, Agent, or Firm*—Foley & Lardner

[57] ABSTRACT

A boundary scan cell is disclosed. Bi-directional input-/output terminals are connected to bi-directional input-/output terminals of a logic circuit subject to test in order to store test data or a test result in a first latch circuit, the output impedance of which changes depending on whether or not the bi-directional input/output terminals are in an input mode or in an output mode. As a result, holding of data is carried out by a static operation, and potential does not change with the lapse of time. Accordingly, there is no restriction on time in the operation for storing data, and erroneous operation is avoided.

8 Claims, 3 Drawing Sheets

BOUNDARY SCAN CELL FOR BI-DIRECTIONAL INPUT/OUTPUT TERMINALS

BACKGROUND OF THE INVENTION

This invention relates to a boundary scan cell which can be applied to bi-directional terminals.

Figure 3:
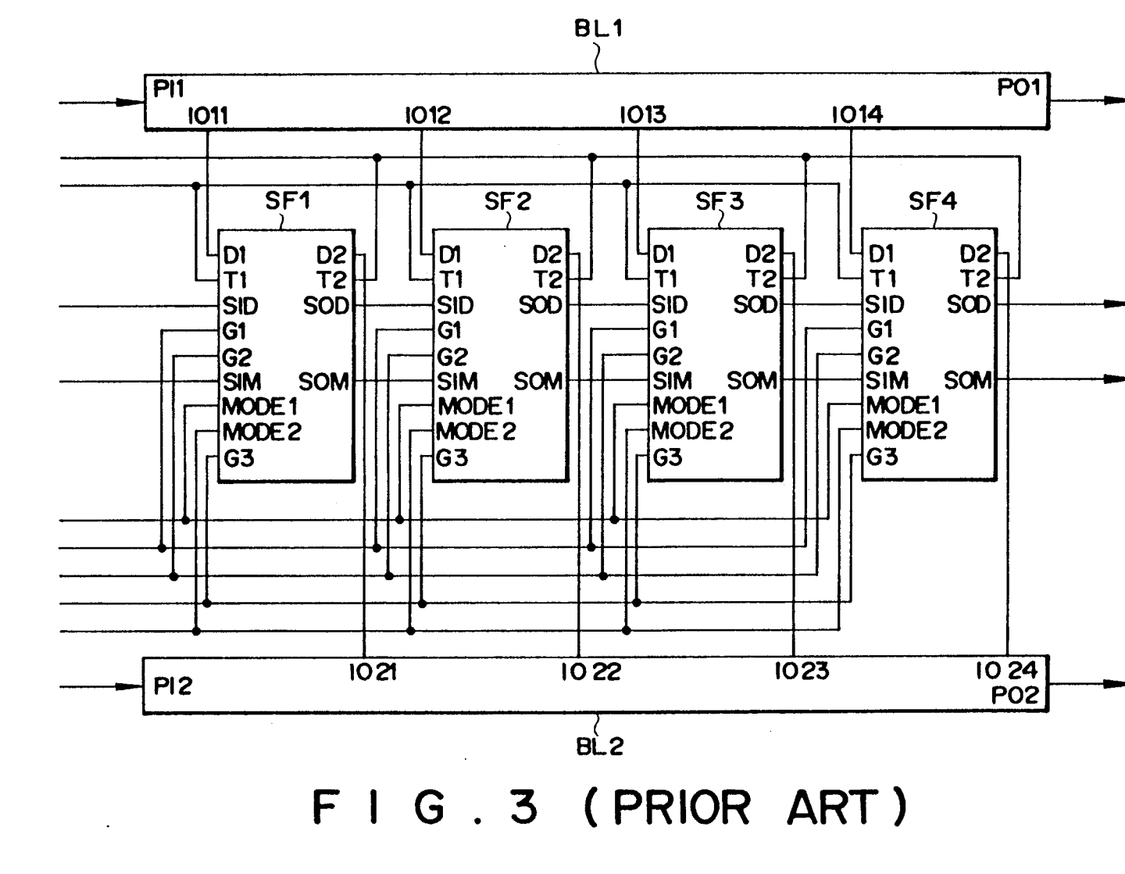
FIG. 3 is a block diagram showing the configuration in the case where boundary scan cells for bi-directional input/output terminals are connected to logic blocks.

As a method of easily testing a semiconductor chip mounted on a board, boundary scan cells have been frequently used in recent years. FIG. 3 shows the configuration of a circuit in which conventional boundary scan cells SF1 to SF4 for bi-directional input/output terminals are arranged. There are provided a block of a logic circuit (hereinafter referred to as a logic block) BL1 having four bi-directional input/output terminals I011 to I014, a terminal PI1 exclusive for an external input, and a terminal PO1 exclusive for an external output, and a logic block BL2 having four bi-directional input/output terminals I021 to I024, a terminal PI2 exclusive for an external input, and a terminal PO2 exclusive for an external output. The boundary scan cells SF1 to SF4 connect the two logic blocks BL1 and BL2 each other at the time of an ordinary operation. For example, the boundary scan cell SF1 connects the bi-directional input/output terminals I011 and I021 through terminals D1 and D2. At the time of test, the boundary scan cell SF1 disconnects this connection, thus permitting testing of each block independently.

Figure 4:
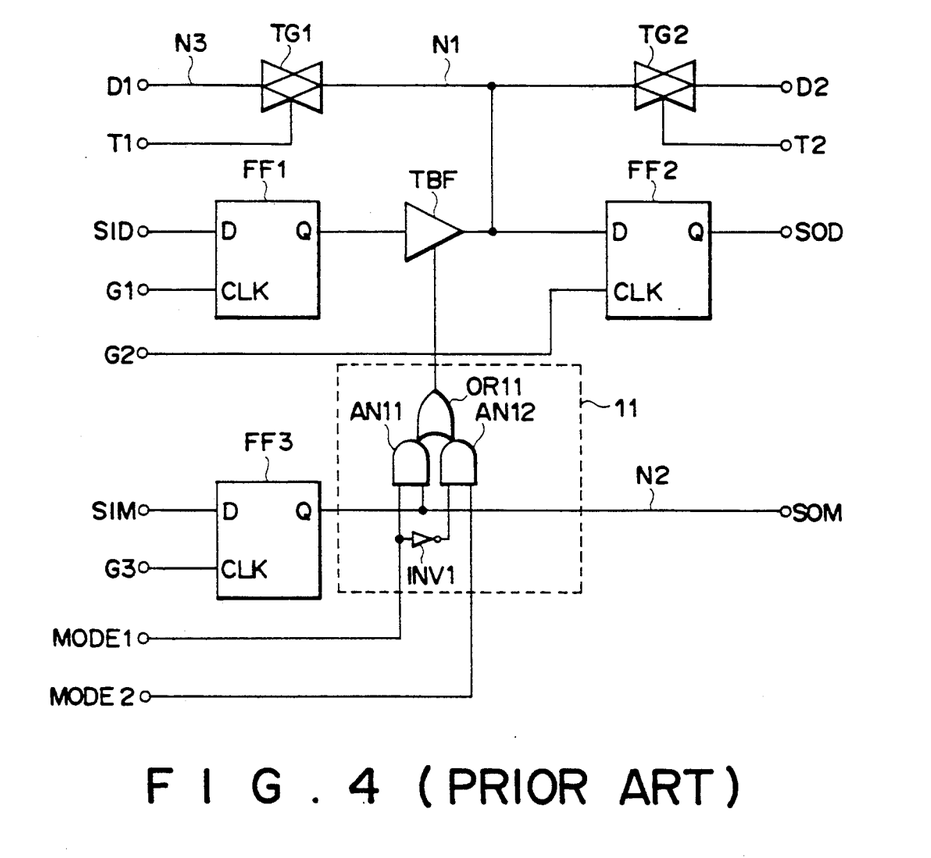
FIG. 4 is a circuit diagram showing the configuration of a conventional boundary scan cell for bi-directional input/output terminals.

The details of the circuit configuration of such a boundary scan cell SF are shown in FIG. 4. Between the terminals D1 and D2, analog switches TG1 and TG2 are connected in series. A signal supplied to a terminal T1 controls the on/off operation of the analog switch TG1. Similarly a terminal T2 controls the analog switch TG2.

A test data input terminal SID to which test data is supplied is connected to a data terminal D of a flip-flop FF1, and a terminal G1 is connected to a clock terminal CLK. An input terminal of an output gate TBF, which is capable of tri-state output, is connected to a positive output terminal Q. The output terminal of the output gate TBF is connected to a node N1 connecting the analog switches TG1 and TG2 and to a data terminal D of a flip-flop FF2. A terminal G2 is connected to the clock terminal CLK of the flip-flop FF2, and a test data output terminal SOD is connected to the positive output terminal Q thereof.

A terminal SIM to which data is supplied is connected to a data terminal D of a flip-flop FF3, and a terminal G3 is connected to a clock terminal CLK. A data output terminal SOM is connected to a positive output terminal Q through a node N2. Further, input terminals of an AND/OR gate 11 comprised of AND circuits AN11 and AN12 and an OR circuit OR11 are respectively connected to terminals MODE1 and MODE2 which is used for mode setting, and an output terminal thereof is connected to the terminal for controlling the operation of the output gate TBF. The terminal MODE1 and an input of an inverter INV1 are connected to one input terminal of the AND circuit AN11. A node N2 is connected to the other input terminal of the AND circuit AN11, and one input terminal of the OR circuit OR11 is connected to the output terminal thereof. Further, the terminal MODE2 which is used for mode setting is connected to one input terminal of the AND circuit AN12, an output terminal of the inverter INV1 being connected to the other input terminal thereof, and the other input terminal of the OR circuit OR11 is connected to the output terminal thereof. The output terminal of the OR circuit OR11 is connected to the enable terminal of the output gate TBF.

The conventional boundary scan cell explained above operates as follows. Description will be first given in connection with the case where the logic block carries out an ordinary operation. When the voltage level of the terminals of T1 and T2 are high level, the analog switches TG1 and TG2 are both turned ON. Further, when the terminals MODE1 and MODE2 are both low level, an output of low level is provided from the AND-/OR gate 11 and is then applied to the output gate TBF. Thus, the output of the gate TBF becomes high impedance. As a result, the terminals D1 and D2 are connected to each other, consequently bi-directional data transmission between logic blocks BL1 and BL2 is possible.

When test of the logic block is carried out, the boundary scan cell operates as follows. The terminals T1 and T2 are both set at a low level. As a result, the analog switches TG1 and TG2 are both turned OFF in a manner opposite to that in the ordinary operating state. Setting of data which assigns input/output modes of corresponding bi-directional input/output terminals of a logic block to be tested is carried out by storing input-/output setting data into the flip-flop FF3. Further, test vector data are stored in the flip-flops FF1 and FF2.

For example, when the logic block BL1 is tested, data which assigns input/output modes of corresponding terminals are set to H or L logic level depending on whether the terminals are input mode or output mode. Here, as shown in FIG. 3, input terminals SIM and output terminals SOM in the boundary scan cells SF1 to SF4 are connected in series, respectively. Accordingly, by supplying a clock signal to the terminals G3 of flip-flops FF3 of the boundary scan cells SF1 to SF4, it is possible to serially transfer input/output mode setting data into the flip-flops FF3. Data store in a flip-flop FF3 controls the output voltage level of gate TBF so that it is in a low impedance state where corresponding bi-directional input/output terminals of the logic block BL1 are in the input mode, and the output of gate TBF becomes high impedance state where those terminals are in the output mode.

While this input mode setting data is stored in FF3, the voltage level terminals MODE1 and MODE2 may be either high level or low level. This is because, even if the output impedance of the gate TBF is assumed to be low impedance, i.e. it is in an output enabling state, since the analog switches TG1 and TG2 are both in an OFF state, the levels of the terminals MODE1 and MODE2 have no influence on the internal states of the logic blocks BL1 and BL2. When storing the input/output mode setting data into the flip-flop FF3 is completed, supply of a clock signal to the terminal G3 is stopped.

Setting of test vector data into the flip-flop FF1 is then carried out. This setting is carried out by storing test vector data into the flip-flop FF1 using input terminal SID. The terminal MODE1 is set at a low level, and the terminal MODE2 is set at a high level. Thus, irrespective of the level of the positive output terminal Q of the, flip-flop FF3, output of the AND/OR gate 11 becomes high level. As a result, the output of gate TBF becomes low impedance, so it becomes output enable state. When the same clock signals are respectively supplied from the output terminals G1 and G2 to the flip-flops FF1 and FF2, the two flip-flops synchronously operate. Thus, test vector data is transferred from the input terminal SID to the output terminal SOD. As shown in FIG. 3, there results a state wherein flip-flops FF1 and FF2 of the respective boundary scan cells SF1 to SF4 are connected to each other in series. Thus, test data are set, respectively. When storing of the test data is completed, the supply of clock signals to the respective flip-flops FF1 and FF2 is stopped. Since the input/output setting data is stored in the flip-flop FF3, and test vector data is stored in the flip-flop FF1, data necessary for test are all stored in flip-flops. Thereafter, test of the logic block BL1 is carried out.

Next the terminals T1 and T2 are set to high level and low level, thus allowing the analog switches TG1 to be turned on and TG2 to be turned off, respectively. At the same time, the terminal MODE1 is set to be at high level, and the terminal MODE2 is set to be at high or low level. In the case where corresponding bi-directional input/output terminals of the logic block BL1 is in an input mode, the output of the output gate TBF becomes low impedance, so it is in an output enable state. As a result, test data stored in the flip-flop FF1 is supplied to corresponding bi-directional input/output terminals of the logic block BL1. In contrast, in the case where the bi-directional input/output terminals are in an output mode, the output gate TBF is set so that it is in a high impedance state. Then, a clock signal is supplied to the terminal G2. Thus, data indicative of a test result are output from the bi-directional input/output terminals of the logic block BL1 and stored in the flip-flop FF2.

Thereafter, the terminal T1 is set at a low level, turning analog switch TG1 OFF. By setting the terminals MODE1 and MODE2 to low level and high level respectively, a signal of high level is output from the AND/OR gate 11 irrespective of the output from flip-flip FF3. Thus, the output of the output gate TBF becomes low impedance state, resulting in an output enable state. When the same clock signals are respectively delivered to the terminals G1 and G2, the flip-flops FF1 and FF2 operate synchronously. Thus, data output from the logic block BL1 is transferred from the terminal SID to the terminal SOD. As a result, test results stored in the respective flip-flops FF2 of the boundary scan cells SF1 to SF4 are serially taken out to the outside.

As stated above, at the time of test mode, except in the case in which test data is input into the logic block BL1, or a test result is taken out therefrom, the analog switches TG1 and TG2 are turned OFF in order that there be no influence on the internal state of the logic block BL1. Thus, the logic block BL1 and the boundary scan cells are disconnected.

The conventional boundary scan cell has the following problem. As described above, in the test mode, except when transmission/reception of data is out between the boundary scan cell and the logic block, the analog switches TG1 and TG2 are in an OFF state, so that there is no influence on the internal state of the logic block. For the time period during which these analog switches TG1 and TG2 are in the OFF state holding of test data to be applied to the bi-directional input/output terminal, or holding of a test result taken out, is accomplished by a dynamic operation to hold charges in a parasitic capacitor on the node N3 connecting the terminal D1 and the analog switch TG1. Charges stored in the parasitic capacitor leak with the elapse of time and gradually decrease. The time required for holding such charges is generally about 50 us. Accordingly, there is established a restriction whereby setting of the input/output mode setting data or the test data must be completed within such an extremely short time. In addition, holding of data by the dynamic operation is apt to be the influenced by power supply noise etc., so sometimes data may change.

SUMMARY OF THE INVENTION

Accordingly, an object of this invention is to provide a boundary scan cell for bi-directional input/output terminals which is free from restriction on holding time of test data and is capable of preventing erroneous operation due to the influence of noise, etc.

In accordance with this invention, there is provided a boundary scan cell for bi-directional input/output terminals which has first and second terminals connected to bi-directional input terminals of a logic circuit subject to test an analog switch between the first and second terminals is set such that when the logic circuit carries out ordinary operation, the analog switch is turned ON to electrically connect the first and second terminals each other, and when the logic circuit is subjected to that, the log switch is turned OFF to electrically disconnects the first and second terminals. A first latch circuit has its output terminal connected to a first signal line and a second signal line, so that, when the logic circuit carries out an ordinary operation, outputs to the first and second signal lines are brought into a high impedance state, and when the logic circuit is subjected to test, outputs to the first and second signal lines are brought into a high impedance or low impedance state depending on whether the bi-directional input/output terminals in an input mode or in an output mode. As a result the first latch circuit stores test data to be given to the logic circuit. When the test data is given to a second latch circuit, the second latch circuit takes it thereinto, to store a test result outputted from the logic circuit. A third latch circuit stores input/output mode setting data, such that when the bi-directional input/output terminals are in the input mode, an output of the first latch circuit is caused to be in a low impedance state, and when the bi-directional input/output terminals are in the output mode, an output of the first latch circuit is caused to be in a impedance state. A fourth latch circuit takes thereinto the input/output mode setting data.

The conventional bi-directional boundary scan cell has the following defects. In holding test data to be given to the logic circuit, or holding a test result taken out from the logic circuit, by a dynamic operation storing charge into a parasitic capacitor on the node connected to the bi-directional input/output terminals, those charges leak and gradually decrease. For this reason, there is restriction on holding time. In addition, test data which has been held may change under the influence of noise, resulting in the possibility of erroneous operation. In contrast in, in accordance with this invention, test data or test result is stored into the first latch circuit (whose output impedance is changeable depending on whether the bi-directional input/output terminals are in the input mode or in the output mode), so that holding of data is carried out by a static operation, thereby eliminating the possibility that a potential may change with the lapse of time. For this reason, the holding operation has no restriction on time, and occurrence of-an erroneous operation is prevented.

BRIEF DESCRIPTION OF THE DRAWINGS

In the attached drawings.

DESCRIPTION OF THE PREFERRED EMBODIMENTS

An embodiment of this invention will now be described with reference to the attached drawings. This embodiment is characterized by the fact that, while the analog switch is in an OFF state, holding of data to bi-directional input/output terminals of the logic block is carried out by the static operation.

Figure 1:
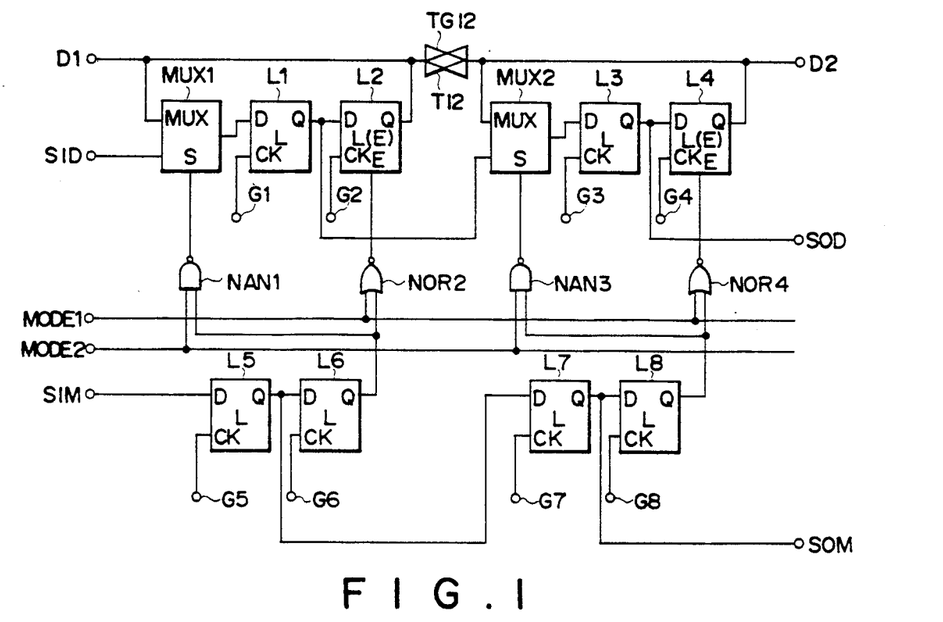
FIG. 1 is a circuit diagram showing the configuration of a boundary scan cell for bi-directional input/output terminals according to an embodiment of this invention.

The connection between the logic blocks and the boundary scan cell is the same as prior art shown in FIG. 3. The configuration of a boundary scan cell for bi-directional input/output terminals according to this embodiment is shown in FIG. 1. This boundary scan cell includes an analog switch TG12, selector gates MUX1 and MUX2, latch circuits L1 and L3, latch circuits L2 and L4 having tri-state output (hereinafter referred to as latch circuits with Hi-Z output), NAND circuits NAN1 and NAN3, NOR circuits NOR2 and NOR4, and latch circuits L5 to L8 for setting data which qualify input/output modes.

Selective control signals for selecting either of two inputs are supplied to terminals S of the selector gates MUX1 and MUX2, respectively. Clock signal terminals G2 and G4 are connected to the clock input of the latch circuits L2 and L4 with Hi-Z output, respectively, and output enable signals for controlling the output impedance to be switched between a high level and a low level are input from terminals E, respectively. G1 and G3, an G8 are clock signal inputs.

Figure 2:
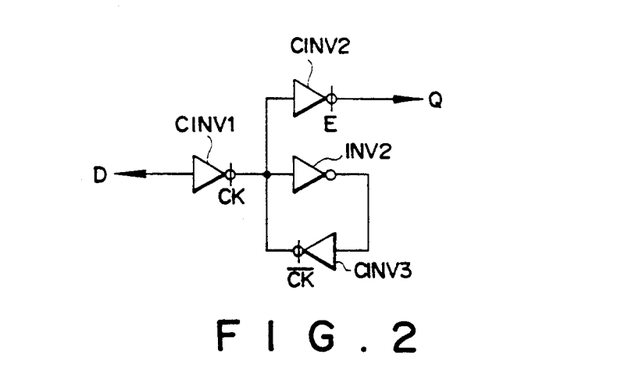
FIG. 2 is a circuit diagram showing the configuration of latch circuit with Hi-Z output provided in a boundary scan cell for bi-directional input/output terminals.

The circuits configuration of the latch circuit with Hi-Z output is shown in FIG. 2. This latch circuit (L2 or L4) is comprised of three clocked inverters CINV1 to CINV3, and an inverter INV2. The clocked inverter CINVI operates by a clock signal CK, and is supplied with a signal from the data terminal D. The output of the clocked inverter CINV1 is connected to the input terminal of the clocked inverter CINV2, the input terminal of the inverter INV2, and the output terminal of the clocked inverter CINV3. The clocked inverter CINV2 operates depending on signal applied to terminal E. The input terminal of the clocked inverter CINV3 is connected to the output terminal of the inverter INV2. When clock signals CK, and $\overline{CK}$ which are opposite in phase, are input to the clocked inverters CINV1 and CINV3, data input from the data terminal D is latched. In the case where the output enable signal is at a low level, clocked inverter CINV2 does not operate, so the output becomes high impedance. In contrast, when an output enable signal of a high level is delivered thereto, clocked inverter INV2 is brought into an output enable state.

The analog switch TG12 is provided between the terminals D1 and D2. This analog switch TG12 executes ON/OFF operation b control signal T12. The terminal D1 is connected to the input terminal of the selector gate MUX1, and the input terminal SID, and output of latch L2. The output terminal of the selector gate MUX1 is connected to the data terminal D of the latch circuit L1. The output terminal Q of the latch circuit L1 is connected to the data terminal D of the latch circuit L2 and input terminal of the selector gate MUX2. In addition, the output terminal Q of the latch circuit L2 is connected to the data terminal D1.

The input terminal of the selector gate MUX2 is connected to the data terminal D2, and the output terminal thereof is connected to the data terminal D of the latch circuit L3. The output terminal Q of the latch circuit L3 is connected to the data terminal D of the latch circuit L4 and the output terminal SOD. The output terminal Q of the latch circuit L4 is connected to the terminal D2.

The output terminal of the NAND circuit NAN1 is connected to the terminal S, to which a selective control signal is input, of the selector gate MUX1, and the output terminal of the NOR circuit NOR2 is connected to the terminal E of the latch circuit L2. The output terminal of the NAND circuit NAN3 is connected to the terminal S, to which a selective control signal is input, of the selector gate MUX2 and the output terminal of the NOR circuit NOR4 is connected to the terminal E of the latch circuit L4.

Input terminals of the NAND circuit NAN1 are connected to the terminal MODE2 and the output terminal Q of the latch circuit L6, respectively. Input terminals of the NOR circuit NOR2 are connected to the terminal MODE1 and the output terminal Q of the latch circuit L6, respectively. Input terminals of the NAND circuit NAN3 are connected to the terminal MODE2 and the output terminal Q of the latch circuit L8, respectively. In addition, input terminals of the NOR circuit NOR4 are connected to the terminal MODE1 and the output terminal Q of the latch circuit L8, respectively.

The data terminal D of the latch circuit 5 is connected to the input terminal SIM, and the output terminal Q thereof is connected to the data terminal D of the latch circuit L6 and the data terminal Q of the latch circuit L7. The output terminal Q of the latch circuit L7 is connected to the data terminal D of the latch circuit L8 and the output terminal SOM.

The boundary scan cell according to this embodiment operates as follows. In an ordinary operating mode, when a control signal T12 of high level is inputted to the analog switch TG12, this switch is turned ON. As a result, the terminals D1 and D2 are connected. Thus, data transfer is carried out between the logic blocks BL1 and BL2. At the same time, a mode signal MODE1 is set at a high level. As a result, signals of low level are outputted both from the NOR circuits NOR2 and NOR4. These signals are respectively input into the term E of the latch circuits L2 and L4, so the outputs thereof are brought into a high impedance state.

The operation in the test mode is as follows. When a control signal T12 of low level is input into the analog switch TG12, this switch is turned OFF. A description will be given for the case where the logic block BL1 is subjected to test. First, setting of data which assigns input/output modes of corresponding bi-directional input/output terminals is carried out. The signals MODE1 and MODE2 are set at a low level and a high level, respectively. When clock signals of an antiphase are respectively delivered to the terminals G5 and G6 of the latch circuits L5 and L7 these latch circuits are brought into an operating state. As a result, input/output mode setting data is input from the input terminal SIM to those latch circuits, and stored therein. During this operation, clock signals delivered through the term G6 and G8 to the latch circuits L6 and L8 are held at a low level, thus maintaining the data hold state. Input/output mode setting data is output from the output terminal SOM through the latch circuits L5 and L7 to the outside. Respective boundary scan cells SF1 to SF4 are such that the input terminal SIM and the output terminal SOM of boundary scan cells are connected each other as shown in FIG. 3. For this reason, input/output mode setting data are stored in the latch circuits L5 and L7 provided in the respective boundary scan cells SF1 to SF4.

Input/output setting data is stored in the latch circuit L6. When an output of high level is provided from the output terminal Q of the latch circuit L6, an output of low level is sent from the NOR circuit NOR2 to the terminal E of the latch circuit L2. As a result, the latch circuit L2 (the third latch circuit) is brought into a high impedance state. Thus, data is output without hindrance from the bi-directional input/output terminal IO11 of the logic block BL1.

Then, setting of test vector data is carried out. The analog switch TG12 is supplied with a control signal T12 of low level to maintain an OFF state. The signals MODE1 and MODE2 are both set at a low level. As a result, selective control signals of high level are outputted from the NAND circuits NAN1 and NAN3. When these select control signals are respectively input from the terminals S into the selector gates MUX1 and MUX2, the selector gate MUX1 selects the input terminal SID of two inputs, and the selector gate MUX2 selects the output terminal Q of the latch circuit L1. Thus, the input terminal SID is connected to the selector gate MUX1. As a result, an input from the input terminal SID is inputted into the data terminal D of the latch circuit L1 through the selector gate MUX1, and an output from the output terminal Q of the latch circuit L1 is input into the data terminal D of the latch circuit L3 through the selector gate MUX2. An output from the output terminal Q of the latch circuit L3 is input from the output terminal SOD into the input terminal SID of the boundary scan cell of the next stage by the output terminal SOD. That is, latch circuits L1 and L3 of the respective boundary scan cells SF1 to SF4 are connected in series. Clock signals of an antiphase are delivered from the terminals G1 and G3 to the latch circuits L1 and L3. Thus, test data is stored in these latch circuits. While such a storing operation is being carried out, other latch circuits L2, L4, L6 and L8 are supplied with clock signals of low level, thus maintaining the hold state. In this way, input/output mode setting data is stored in each latch circuit L5, and test data is stored in each latch circuit L1.

Then, an operation is carried out to transfer input/output mode setting data stored in the latch circuit L5 to the latch circuit L6 and to transfer test data stored in the latch circuit L1 to the latch circuit L2.

A one-shot pulse is input into the terminal G6 of the latch circuit L6, whereby input/output mode setting data is transferred from the latch circuit L5 to the latch circuit L6. Further, a one shot pulse is input into the terminal G2 of the latch circuit L2, whereby test data is transferred from the latch circuit L1 to the latch circuit L2. Further, the terminal MODE1 is set at a low level, so the input/output mode setting data transferred to the latch circuit L6 is inputted into the terminal E of the latch circuit L2. When the input mode is selected as the operational mode, the latch circuit L2 is brought into an output enable state. As a result, test data stored therein is output and is input into corresponding bi-directional input/output terminals of the logic block BL1. In contrast, in the case of the output mode, since input/output mode setting data of low level is input from the latch circuit L6 into the latch circuit L2, the output thereof is brought into a high impedance state. Then, the terminal MODE2 is set at a high level. Thus, a signal of low level is delivered to the terminal S of the selector gate MUX1, so the terminal D1 is selected. Then, a one-shot pulse is input into the terminal G1 of the latch circuit L1, whereby an output indicative of a test result output from corresponding bi-directional input/output terminals of the logic block BL1 is stored in the latch circuit L1.

The terminal MODE2 is set at a low level, so a selective control signal of high level is inputted into the terminals S of the selector gates MUX1 and MUX2. In response to this, the terminal SID is selected by the selector gate MUX1, and the output terminal Q of the latch circuit L1 is selected by the selector gate MUX2. Thus, the terminal SID is connected to the data terminal D of the latch circuit L1, and the output terminal Q of the latch circuit L1 is to the data terminal D of the latch circuit L3. This results in a state wherein latch circuits L1 and L3 of the respective boundary scan cells SF1 to SF4 are connected in series. When clock signals of an antiphase are delivered to the terminals G1 and G3 of the latch circuits L1 and L3, a test result is taken out from the output terminal SOD to the outside.

In accordance with this embodiment, the content of the test data stored in the latch circuit L2 with Hi-Z output is held by a static mode because the terminal CK is held at low level. In the conventional boundary scan cell, since holding of test data of the bi-directional input/output terminals is carried out by the dynamic operation by holding charges in a parasitic capacitor on the node connected to the terminal as described above, charge leakage occurs and gradual decrease takes place. For this reason, storing of data had to be completed within an extremely short time, and erroneous operation was apt to occur. In this invention, since holding of data is carried out by a static operation using latch circuits L2 and L4, such problems are eliminated, and there is no restriction in time in storing data. For recent integrated circuits, the number of boundary scan cells of one scan chain has tended to increase. Thus, the boundary scan cell of this embodiment, which is free from restriction in time in storing data, is useful. In addition, in accordance with this embodiment, since holding of data is carried out by the a static operation, it is also possible to prevent erroneous operation from occurring due to the influence of noise, etc.

What is claimed is:

1. A boundary scan cell for bi-directional input/output terminals comprising:
   a first terminal connected to a bi-directional input/output terminal of a first logic circuit subject to test;
   a second terminal connected to a bi-directional input/output terminal of a second logic circuit subject to test;

an analog switch between the first and second terminals, said analog switch being operable to electrically connect the first and second terminals to each other during an ordinary operation, and to electrically disconnect the first and the second terminals in a test mode, when at least one of the first and second logic circuits is subjected to test;

a first latch circuit means receiving an storing input/output mode setting data which sets whether the bi-directional input/output terminal of the first logic circuit is in an input mode or in an output mode;

a second latch circuit means receiving and storing input/output mode setting data which sets whether the bi-directional input/output terminal of the second logic circuit is in an input mode or in an output mode;

a third latch circuit means receiving and storing test data input to the first logic circuit; and a fourth latch circuit means receiving and storing test data input to the second logic circuit, means operable to transmit the test data stored in the third latch circuit means to the first terminal when the input/output mode setting data stored in the first latch circuit means indicates that the bi-directional input/output terminal of the first logic circuit is in an input mode, and to activate the first latch circuit means to control an output impedance of the third latch circuit means such that the test data stored in the third latch circuit means is not transmitted to the first input terminal when the input/output mode setting data stored in the first latch circuit means indicates that the bi-directional input/output terminal of the first logic circuit is in an input mode, and means operable to transmit the test data stored in the fourth latch circuit means to the second input terminal when the input/output mode setting data stored in the second latch circuit means indicates that the bi-directional input/output terminal of the second logic circuit is in an input mode, and to activate the second latch circuit means to control an output impedance of the fourth latch circuit means such that the test data stored in the fourth latch circuit means is not transmitted to the second terminal when the input/output mode setting data stored in the second latch circuit means indicates that the bi-directional input/output terminal of the second logic circuit is in an output mode.

2. A boundary scan cell for bi-directional input/output terminals as recited in claim 1, wherein the third latch circuit means comprises an output high impedance feature, the output impedance of the third latch circuit means being set at one of a high level and a low level depending upon the input/output mode setting data stored in and output from the first latch circuit means to the third latch circuit and the fourth latch circuit means comprises an output high impedance feature, the output impedance of the fourth latch circuit means being set at one of a high level and a low level depending upon the input/output mode setting data stored in and output from the second latch circuit means to the fourth latch circuit.

3. A boundary scan cell for bi-directional input/output terminals as recited in claim 1, the third latch circuit means comprising:

a first output connected to the first terminal;
a first input inputting the test data;
a first output impedance setting terminal controlled by an output form the first latch circuit means;
a first clocked inverter having a first clocked inverter input connected to the first input and having a first clocked inverter output, the first clocked inverter operating in response to a first clock signal;
a second clocked inverter having a second clocked inverter input connected to the first clocked inverter output and having a second clocked inverter output connected to the first terminal, the second clocked inverter operation depending upon a level of the first output impedance setting terminal;
a first inverter having a first inverter connected to the first clocked inverter output and having a first inverter output; and
a third clocked inverter having a third clocked inverter input connected to the first inverter output and having a second clocked inverter output connected to the first inverter output, the third clocked inverter being responsive to a signal which is an inverse of the first clock signal, and the fourth latch circuit means comprising:
a second output connected to the second terminal;
a second input inputting the test data;
a second output impedance setting terminal controlled by an output from the second latch circuit means;
a fourth clocked inverter having a fourth clocked inverter input connected to the second input, and having a fourth clocked inverter output, the fourth clocked inverter operating in response to a second clock signal;
a fifth clocked inverter having a fifth clocked inverter input connected to the fourth clocked inverter output and having a fifth clocked inverter output connected to the second terminal, the fifth clocked inverter operation depending upon a level of the second output impedance setting terminal;
a second inverter having a second inverter input connected to the fourth clocked inverter output and having a second inverter output; and
a sixth clocked inverter having a sixth clocked inverter input connected to the second inverter output, and having a sixth clocked inverter output connected to the fourth clocked inverter output, the sixth clocked inverter being responsive to a signal which is an inverse of the second clock signal.

4. A boundary san cell for bi-directional input/output terminals as recited in claim 3, wherein
the second latch circuit means comprises a D-flip-flop and when the input/output mode setting data is transmitted thereto, the second latch circuit means holds the input/output mode setting data, and
the fourth latch circuit means comprises a D-flip-flop and when the test data is transmitted thereto, the fourth latch circuit means holds the test data.

5. A boundary scan cell for bi-directional input/output terminals comprising:
a first terminal connected to a bi-directional input/output terminal of a first logic circuit subject to test;
a second terminal connected to a bi-directional input/output terminal of a second logic circuit subject to test;

an analog switch between the first and second terminals, said analog switch being operable to connect the first and second terminals to each other during an ordinary operation, and to electrically disconnect the first and the second logic circuits is subjected to test;

a first latch circuit receiving and storing input/output mode setting data which sets whether the bi-directional input/output terminal for the first logic circuit is in an input mode or in an output mode;

a second latch circuit receiving and storing input/output mode setting data which sets whether the bi-directional input/output terminal for the second logic circuit is in an input mode or in an output mode;

a third latch circuit receiving and storing first logic circuit test data when test data input to the first logic circuit is transmitted thereto; and a fourth latch circuit receiving and storing second logic circuit test data when test data input to the second logic circuit is transmitted thereto;

a fifth latch circuit for holding the input/output mode setting data transmitted thereto from the first latch circuit;

a sixth latch circuit for holding the input/output mode setting data given thereto from the second input/output mode setting data transmitted thereto from the second latch circuit;

a seventh latch circuit for holding test data transmitted thereto from the third latch circuit;

an eighth latch circuit for holding the test data transmitted thereto form the fourth latch circuit, means operable to transmit the test data stored in the seventh latch circuit to the first terminal when the input/output mode setting data stored in the firth latch circuit indicates that the bi-directional input/output terminal of the first logic circuit is in an input mode, and to activate the fifth latch circuit to control an output impedance of the seventh latch circuit such that the test data stored in the seventh latch circuit is not transmitted to the first terminal when the input/output mode setting data stored in the fifth latch circuit indicates that the bi-directional input/output terminal of the first logic circuit is in an output mode;

means operable to transmit the test data stored in the eighth latch circuit to the second terminal when the input/output mode setting data stored in the sixth latch circuit indicates that the bi-directional input/output terminal for the second logic circuit is in an input mode, and to activate the sixth latch circuit to control an output impedance of the eighth latch circuit such that the test data stored in the eighth latch circuit is not transmitted to the second terminal when the input/output mode setting data stored in the sixth latch circuit indicates that the bi-directional input/output terminal of the second logic circuit is in an output mode.

6. A boundary scan cell for bi-directional input/output terminals as set forth in claim 5, wherein the boundary scan cell further comprises:

a first selector gate having two input terminals and an output terminal, one of the input terminals of the first selector gate being connected to the first terminal, the other input terminal of the fist selector gate being connected to a test data input terminal for receiving test data input, the output terminal of the first selector gate being connected to an input terminal of the third latch circuit; and a second selector gate having two input terminals and an output terminal, one of the input terminals of the second selector gate being connected to the second terminal, the other input terminal of the second selector gate being connected to an output of the third latch circuit, the output terminal of the second selector gate being connected to an input of the fourth latch circuit;

the first selector gate being operable to connect the test data input terminal with the input of the third latch circuit when the third latch circuit requires the test data, and to connect the first terminal with the input of the third latch circuit when the third latch circuit requires a test result data from the bi-directional input/output terminal of the first logic circuit;

the second selector gate being operable to connect the output of the third latch circuit with the input of the fourth latch circuit when the fourth latch circuit requires the test data, and to connect the second terminal with the input of the fourth latch circuit when the fourth latch circuit requires a test result data from the bi-directional input/output terminal of the first logic circuit.

7. A boundary scan cell for bi-directional input/output terminals as set forth in claim 5, wherein the seventh latch circuit has an output high impedance feature, the output impedance of the seventh latch circuit becoming one of a high level and a low level depending upon the input/output mode setting data stored in and output form the fifth latch circuit to the seventh latch circuit, and the eighth latch circuit has an output high impedance feature, the output impedance of the eighth latch circuit becoming one of a high level and a low level depending upon the input/output mode setting data stored and output for the sixth latch circuit to the eighth latch circuit.

8. A boundary scan cell for bi-directional input/output terminals as set forth in claim 5, the seventh latch circuit comprising;

a first output connected to the first terminal;

a first input inputting the test data;

a first output impedance setting terminal controlled by an output form the fifth latch circuit;

a first clocked inverter having a first clocked inverter input connected to the first input, and having a first clocked inverter output, the first clocked inverter operating in response to a first clock signal;

a second clocked inverter having a second clocked inverter input connected to the first clocked inverter output and having a second clocked inverter output connected to the first output, the second clocked inverter operation depending upon a level of the second output impedance setting terminal;

a first inverter having a first inverter input connected to the first clocked inverter output and having a first inverter output;

a third clocked inverter having a third clocked inverter input connected to the first inverter output and having a third clocked inverter output connected to the first clocked inverter output, the third clocked inverter being responsive to a signal which is an inverse of the first clock signal, the eighth latch circuit comprising:

a second output connected to the second terminal;

a second input inputting the test data;
a second output impedance setting terminal controlled by an output for the sixth latch circuit;
a fourth clocked inverter having a fourth clocked inverter input connected to the second input and having a fourth clocked inverter output, the fourth clocked inverter being responsive to a second clock signal;
a fifth clocked inverter having a fifth clocked inverter input connected to the fourth clocked inverter output and, having a fifth clocked inverter output connected to the second terminal, the fifth clocked inverter operation depending upon a level of the second output impedance setting terminal;
a second inverter having a second inverter input connected to the fourth clocked inverter output and having a second inverter output, and
a sixth clocked inverter having a sixth clocked inverter input connected to the second inverter output, and having a sixth clocked inverter output connected to the fourth clocked inverter output, the sixth clocked inverter being responsive to a signal which is an inverse of the second clock.

* * * * *